(12) United States Patent
Randall

(10) Patent No.: US 7,932,638 B2
(45) Date of Patent: Apr. 26, 2011

(54) RELIABLE CONTACT AND SAFE SYSTEM AND METHOD FOR PROVIDING POWER TO AN ELECTRONIC DEVICE

(75) Inventor: Mitch Randall, Longmont, CO (US)

(73) Assignee: Pure Energy Solutions, Inc., Boulder, CO (US)

( * ) Notice: Subject to any disclaimer, the term of this patent is extended or adjusted under 35 U.S.C. 154(b) by 567 days.

(21) Appl. No.: 11/800,427

(22) Filed: May 3, 2007

(65) Prior Publication Data

US 2009/0098750 A1   Apr. 16, 2009

Related U.S. Application Data

(60) Continuation-in-part of application No. 11/682,309, filed on Mar. 5, 2007, and a continuation-in-part of application No. 11/672,010, filed on Feb. 6, 2007, and a continuation-in-part of application No. 11/670,842, filed on Feb. 2, 2007, said application No. 11/682,309 is a continuation-in-part of application No. 11/672,010, filed on Feb. 6, 2007, which is a continuation-in-part of application No. 10/732,103, filed on Dec. 10, 2003, now Pat. No. 7,172,196, said application No. 11/670,842 is a division of application No. 10/732,103, filed on Dec. 10, 2003, now Pat. No. 7,172,196.

(60) Provisional application No. 60/797,140, filed on May 3, 2006, provisional application No. 60/778,761, filed on Mar. 3, 2006, provisional application No. 60/781,456, filed on Mar. 10, 2006, provisional application No. 60/776,332, filed on Feb. 24, 2006, provisional application No. 60/444,826, filed on Feb. 4, 2003, provisional application No. 60/441,794, filed on Jan. 22, 2003, provisional application No. 60/432,072, filed on Dec. 10, 2002.

(51) Int. Cl.
*H02J 1/00* (2006.01)
*H02J 7/00* (2006.01)

(52) U.S. Cl. .......................... 307/75; 307/150; 320/108

(58) Field of Classification Search .................. 370/75, 370/150; 174/268; 320/108
See application file for complete search history.

(56) References Cited

U.S. PATENT DOCUMENTS

| 4,616,832 A | 10/1986 | Groner |
| 5,527,637 A | 6/1996 | Nakazawa et al. |

(Continued)

OTHER PUBLICATIONS

International Search Report of PCT/US08/062717, dated Aug. 18, 2008.

*Primary Examiner* — Hal I. Kaplan
(74) *Attorney, Agent, or Firm* — James R. Young; Cochran Freund & Young LLC

(57) ABSTRACT

An electronic system which includes a power delivery surface that delivers electrical power to an electrical or electronic device. The power delivery surface may be powered by any electrical power source, including, but not limited to: wall electrical outlet, solar power system, battery, vehicle cigarette lighter system, direct connection to electrical generator device, and any other electrical power source. The power delivery surface delivers power to the electronic device wirelessly. The power delivery surface may deliver power via a plurality of contacts on the electrical device conducting electricity from the power delivery surface. The electrical device may be mobile device. Each contact may be shaped to improve power delivery reliability. The power delivery surface may further include circuitry to protect against accidental electrocutions.

23 Claims, 10 Drawing Sheets

U.S. PATENT DOCUMENTS

| | | | |
|---|---|---|---|
| 5,868,076 A | 2/1999 | Myus et al. | |
| 5,890,717 A | 4/1999 | Rosewarne et al. | |
| 5,999,410 A * | 12/1999 | Weiler | 361/749 |
| 6,037,750 A * | 3/2000 | Von Novak | 320/132 |
| 6,044,767 A | 4/2000 | Myus et al. | |
| 6,459,175 B1 | 10/2002 | Potega | |
| 6,509,717 B2 | 1/2003 | Lee | |
| 6,768,288 B2 | 7/2004 | Rosenquist et al. | |
| 6,824,281 B2 | 11/2004 | Schofield et al. | |
| 6,851,961 B2 * | 2/2005 | Lin | 439/221 |
| 6,913,477 B2 | 7/2005 | Dayan et al. | |
| 7,176,655 B2 | 2/2007 | Kogan et al. | |
| 7,392,068 B2 * | 6/2008 | Dayan et al. | 455/572 |
| 7,474,875 B1 * | 1/2009 | Dayan et al. | 455/41.2 |
| 2004/0048511 A1 | 3/2004 | Dayan et al. | |
| 2004/0082369 A1 | 4/2004 | Dayan et al. | |
| 2006/0205381 A1 | 9/2006 | Beart et al. | |

\* cited by examiner

210
TOPOGRAPHIC
VIEW OF TOP

REMOVEABLE POWER RECEIVER 501

112

502 PLUG
501
120  SIDE  120

502
570
501
120  FRONT  120
503 WEIGHT BEARING SURFACE 120
501
BOTTOM 502
120
501

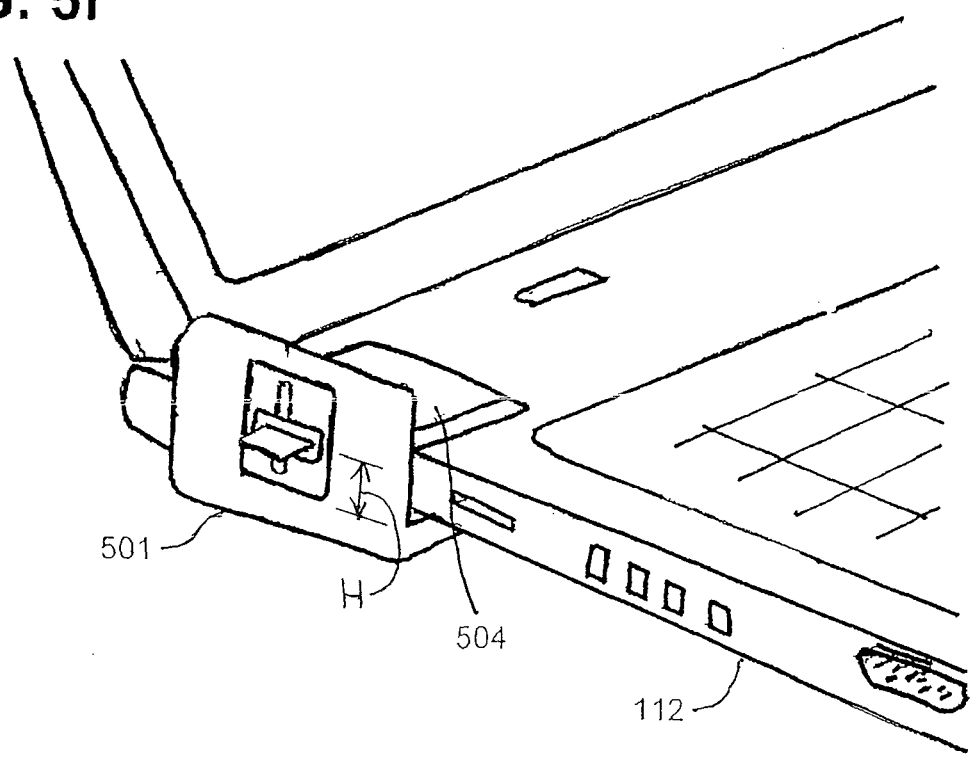

RELIABLE CONTACT AND SAFE SYSTEM AND METHOD FOR PROVIDING POWER TO AN ELECTRONIC DEVICE

CROSS-REFERENCES TO RELATED APPLICATIONS

This application claims the benefit of U.S. Provisional Application No. 60/797,140, filed May 3, 2006, all of which is incorporated herein by reference, and it is a continuation-in-part of U.S. patent application Ser. No. 11/670,842, filed Feb. 2, 2007, U.S. patent application Ser. No. 11/672,010, filed on Feb. 6, 2007 which additionally claims the benefit of U.S. Provisional Application No. 60/776,332, filed Feb. 24, 2006, and U.S. patent application Ser. No. 11/682,309, filed on Mar. 5, 2007 which additionally claims the benefit of U.S. Provisional Application No. 60/778,761, filed Mar. 3, 2007, U.S. Provisional Application No. 60/781,456, filed Mar. 10, 2007, which are a divisional patent application and two continuation-in-part patent applications, respectively, wherein the divisional application is a divisional from U.S. patent application Ser. No. 10/732,103, filed on Dec. 10, 2003, which claims the benefit of U.S. Provisional Application Nos. 60/432,072, filed Dec. 10, 2002, U.S. Provisional Application No. 60/441,794, filed Jan. 22, 2003, and U.S. Provisional No. 60/444,826, filed Feb. 4, 2003, all of which are also incorporated herein by reference.

BACKGROUND OF THE INVENTION

1. Field of the Invention

The present invention relates to electronic systems and methods for providing electrical power to one or more electronic devices with a power delivery surface.

2. Description of the Related Art

A variety of electronic devices, such as toys, game devices, cell phones, laptop computers, cameras and personal digital assistants, have been developed along with ways for powering them. Mobile electronic devices typically include a battery which is rechargeable by connecting it through a power cord unit to a power source, such as an electrical outlet. A non-mobile electronic device is generally one that is powered through a power cord unit and is not intended to be moved during use.

In a typical set-up for a mobile device, the power cord unit includes an outlet connector for connecting it to the power source and a battery connector for connecting it to a corresponding battery power receptacle of the battery. The outlet and battery connectors are in communication with each other so electrical signals flow between them. In this way, the power source charges the battery through the power cord unit.

In some setups, the power cord unit also includes a power adapter connected to the outlet and battery connectors through AC input and DC output cords, respectively. The power adapter adapts an AC input signal received from the power source through the outlet connector and AC input cord and outputs a DC output signal to the DC output cord. The DC output signal flows through the battery power receptacle and is used to charge the battery.

Manufacturers, however, generally make their own model of electronic device and do not make their power cord unit compatible with the electronic devices of other manufacturers, or with other types of electronic devices. As a result, a battery connector made by one manufacturer will typically not fit into the battery power receptacle made by another manufacturer. Further, a battery connector made for one type of device typically will not fit into the battery power receptacle made for another type of device. Manufacturers do this for several reasons, such as cost, liability concerns, different power requirements, and to acquire a larger market share.

This may be troublesome for the consumer because he or she has to buy a compatible power cord unit for their particular electronic device. Since people tend to switch devices often, it is inconvenient and expensive for them to also have to switch power cord units. Further, power cord units that are no longer useful are often discarded which leads to waste. Also, people generally own a number of different types of electronic devices and owning a power cord unit for each one is inconvenient because the consumer must deal with a large quantity of power cord units and the tangle of power cords the situation creates.

BRIEF SUMMARY OF THE INVENTION

An embodiment of the present invention may comprise an electrical apparatus, comprising: a power delivery surface that comprises at least a part of a support surface, the power delivery surface being connected to an electrical power source, the power delivery surface being capable of supplying electrical power, and the power delivery surface having a plurality of pads, wherein some of the pads are at a first voltage level and others of the pads are at a second voltage level; an electrical device, which is supplied electricity and is positionable in any location on a support surface, the electrical device obtaining electrical power from the power delivery surface that is at least part of the support surface; a plurality of contacts that are part of the electrical device, the plurality of contacts are spaced apart in relation to each other in positions to make power delivery capable contact with the power delivery surface; and a contact face for each contact of the plurality of contacts that has a plurality of raised regions that act as independent contact regions for power delivery capable contact with the power delivery surface.

An embodiment of the present invention may further comprise an electrical apparatus, comprising: a power delivery surface that comprises at least a part of a support surface, the power delivery surface being connected to an electrical power source, the power delivery surface being capable of supplying electrical power; an electrical device, which is supplied electricity and is positionable in any location on a support surface, the electrical device obtaining electrical power from the power delivery surface that is at least part of the support surface; a capacitive load detection circuit that detects a capacitive load on the power delivery surface; and a shut down circuit that turns off the power delivery surface when a capacitive load exceeds a preset capacitive load limit.

An embodiment of the present invention may further comprise an electrical apparatus, comprising: a power delivery surface that comprises at least a part of a support surface, the power delivery surface being connected to an electrical power source, the power delivery surface being capable of supplying electrical power, and the power delivery surface having a plurality of pads, wherein some of the pads are at a first voltage level and others of the pads are at a second voltage level; and an electrical device, which is supplied electricity and is positionable in any location on a support surface, the electrical device obtaining electrical power from the power delivery surface that is at least part of the support surface; a power receiver device that is attached and electrically connected to the electrical device in order to provide a plurality of contacts to the electrical device, the plurality of contacts are spaced apart in relation to each other in positions to make power delivery capable contact with the power delivery surface.

These and other features, aspects, and advantages of the invention will become better understood with reference to the following drawings, description, and claims.

BRIEF DESCRIPTION OF THE DRAWINGS

FIG. 5f is a schematic diagram of a removable power receiver with a spring loaded shelf that adds contacts for use with a power delivery surface attached to a larger host mobile device.

DETAILED DESCRIPTION OF THE INVENTION

Figure 1A:
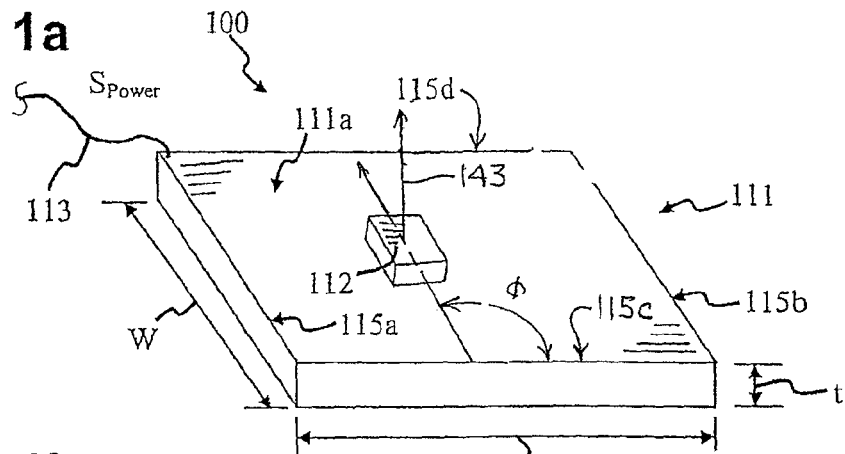
FIG. 1a is a perspective view of a power delivery system, in accordance with the invention, which includes a power delivery support structure operatively coupled with an electronic device.

FIG. 1a is a perspective view of a power delivery system 100, in accordance with the invention, for providing power to an electrical or electronic device 112 with a power delivery surface 111a. System 100 has many different embodiments that provide the features discussed herein and as well as other features. Several embodiments are discussed in co-pending U.S. patent application Ser. No. 11/670,842 filed on Feb. 2, 2007, co-pending U.S. patent application Ser. No. 11/672,010 filed Feb. 6, 2007, and co-pending U.S. patent application Ser. No. 11/682,309 filed Mar. 5, 2007. Power delivery system 100 can power more than one electronic device made by the same or different manufacturers. It can also power different types of electronic devices. This reduces the need for the consumer to have a power cord unit for each electronic device they use. Electronic device 112 can be of many different types, such as a toys, game devices, cell phone, laptop computer, camera, personal digital assistant, etc. Most of these devices are mobile and powered by a rechargeable battery. However, the invention is also applicable to electronic devices, such as a desktop computer, that are not generally considered to be mobile.

System 100 includes a power delivery support structure 111 connected to a power source (not shown, but indicated as $S_{Power}$) through a power cord unit 113. The power source $S_{Power}$ can be of many different types, such as an electrical outlet or battery, and provides a potential difference through the power cord unit 113 to separate conductive regions in structure 111. The potential difference is provided to electronic device 112 in response to device 112 being carried by structure 111 on surface 111a. In this way, surface 111a operates to deliver power to electronic device 112.

Electronic device 112 can be powered in many different ways by the power delivery surface. For example, surface 111a can provide charge to a battery included in device 112, which is often the case for mobile devices. Device 112 can also be powered directly by surface 111a. This is useful in situations where device 112 is not battery operated or it is desirable to operate device 112 with its battery removed. An example of this is when using a laptop computer, which can operate if power is provided to it by surface 111a after its battery has been removed.

Power delivery support structure 111 can include many different materials, but it preferably includes an insulative material with separate conductive regions which define at least a portion of surface 111a. As discussed in more detail below, the conductive regions, are, for example, by a gap G, so they provide the potential difference to electronic device 112.

In this embodiment, electronic device 112 includes and carries contacts and an electronic circuit which are in communication with each other. In operation, the circuit receives the potential difference from the power delivery surface through the contacts when they engage surface 111a. The potential difference is rectified by the electronic circuit to provide a desired voltage potential which is used to power electronic device 112. It is advantageous that the circuit be carried by device 112 so it can be designed to receive the potential difference from the power delivery surface and provide device 112 with the desired voltage potential.

This feature is useful because sometimes it is desirable to power multiple electronic devices with the power delivery surface. These devices may operate in response to different ranges of voltage potentials. In some situations, the electronic devices are the same type of device (i.e. two cell phones). The electronic devices can be the same models and have the same voltage requirements or they can be different models and have different voltage requirements. The different models can be made by the same or different manufacturers. In other situations the electronic devices are different types of devices (i.e. a cell phone and laptop computer). Different types of devices generally require different ranges of voltage potentials, although they can be the same in some examples. The different types of devices can be made by the same or different manufacturers. Hence, the electronic circuit for each device is designed so the power delivery surface can provide power to multiple electronic devices having many different voltage requirements.

In accordance with the invention, the contacts are arranged so the potential difference is provided to the electronic circuit independently of the orientation of device 112 on power delivery surface 111a. In other words, the potential difference is provided to the electronic circuit for all angles φ. This feature is advantageous for several reasons. For example, the contacts can engage surface 111a without the need to align them with it, so at least two contacts are at different potentials. In this example, angle φ corresponds to the angle between a side, for example, side 115c, of structure 111 and a reference line 142, for example, a longitudinal axis extending through device 112 and parallel to surface 111a. It should be noted, however, that another reference line other than the longitudinal axis can be used. Here, angle φ can have values between about 0° and 360°, as the device 112 is oriented or reoriented angularly about a vertical axis 143.

This feature is also advantageous when powering multiple electronic devices because they can be arranged in many more different ways on surface 111a. This allows surface 111a to be used more efficiently so more devices can be carried on and charged by the power delivery surface 111a. This is useful in situations where there are not enough electrical outlets available to charge the multiple electronic devices individually. In general, structure 111 can carry more electronic devices when length L and/or width W are increased and fewer when length L and/or width W are decreased. The number of devices that structure 111 can carry also depends on their size. For example, cell phones are typically smaller than laptop computers, so more cell phones than laptop computers could be positional at the same time on a given power delivery surface 111a.

Power delivery support structure 111 can have many different shapes, but here it is shown with surface 111a being rectangular so structure 111 defines a cubic volume. Surface 111a is shown as being substantially flat and the separate conductive regions 114, 118 define continuous surfaces separated from each other by an insulative material region. The distance between the conductive regions 114, 118 is referred to as the gap G. Surface 111a extends between opposed sides 115a and 115b, as well as between opposed sides 115c and 115d. Opposed sides 115c and 115d extend from opposite ends of sides 115a and 115b and between them. Sides 115a and 115b are oriented at non-zero angles relative to sides 115c and 115d. In this particular example, the non-zero angle is about 90° since surface 111a is rectangular. In other examples, surface 111a can be curved, triangular, etc. When surface 111a is circular, structure 111 defines a cylindrical volume.

Figure 1B:
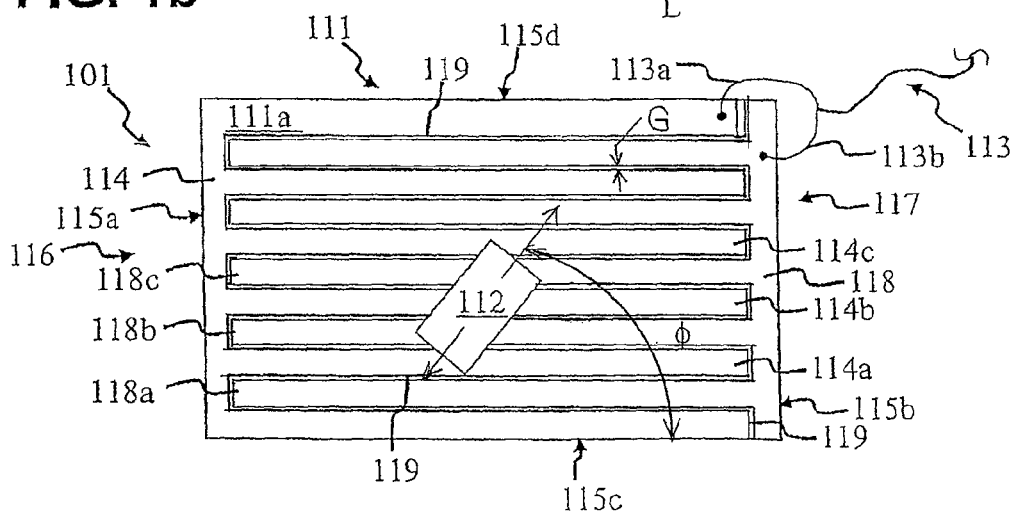
FIG. 1b is a top view of another embodiment of an electronic system with a power delivery surface for providing power to an electronic device.

FIG. 1b is a top view of an electronic system, embodied as a power delivery system 101, for providing power with a power delivery surface 111a to electronic device 112. System 101 is similar to system 100 and includes power delivery support structure 111 and power cord unit 113. In this embodiment, the power delivery surface, denoted as surface 111a, includes two separate conductive regions, denoted as regions 116 and 117. Regions 116 and 117 are separated from each other by an electrically insulative region 119 in the gap G and define separate continuous surfaces. In this document, the distance of the separation between conductive regions achieved by the insulative region 119 is generally referred as the gap G.

Region 119 provides electrical isolation between conductive regions 116 and 117 so a potential difference can be provided between them. If a current flows between conductive regions 116 and 117, it also flows through the electronic circuit carried by electronic device 112 when the contacts engage surface 111a. In this way, power is provided to device 112 when it is carried by power delivery support structure 111. If a current flows between regions 116 and 117 without flowing through the electronic circuit, then it is typically an undesirable leakage current. In general, as the separation between regions 116 and 117 increases, the leakage current decreases. Similarly, as the separation between regions 116 and 117 decreases, the leakage current increases. The leakage current also depends on the material included in insulative region 119.

In this embodiment, conductive region 116 includes a base contact 114 which extends along side 115a and between sides 115c and 115d. Region 116 also includes a first plurality of contact pads, some of which are denoted as contact pads 114a, 114b and 114c. These contact pads are connected to base contact 114 and extend outwardly from it and towards side 115b. Conductive region 117 includes a base contact 118 which extends along side 115b and between sides 115c and 115d. Region 117 also includes a second plurality of contact pads, some of which are denoted as contact pads 118a, 118b and 118c. These contact pads are connected to base contact 118 and extend outwardly from it and toward side 115a. It should be noted that contacts 114 and 118 extend all the way between sides 115c and 115d. However, in other embodiments, they can extend partially between sides 115c and 115d. It should also be noted that base contacts 114 and 118 are shown as being rectangular in this example, but they can have other shapes, such as curved or triangular, in others.

In this example, contact pads 114a-114c and 118a-118c extend parallel to each other and are interleaved so contact pad 114a is positioned between contact pad 118a and 118b, and contact pad 114b is positioned between contact pads 118b and 118c. As shown in FIG. 1b, the other contact pads in regions 116 and 117 are interleaved in the same manner. It should be noted that in some examples, the different contact pads in regions 117 and 118 can be connected together with vias.

Power cord unit 113 includes conductive lines 113a and 113b which are connected to conductive regions 116 and 117, respectively. In one mode of operation, the power supply provides conductive regions 116 and 117 with different voltage potentials through corresponding conductive lines 113a and 113b. In this mode, there is a potential difference between regions 116 and 117, and device 112 is provided with power in response to it, when device 112 is carried on surface 111a and the contacts engage surface 111a. In this way, surface 111a is arranged so a potential difference is provided between at least two of the contacts carried by device 112.

It should be noted that more than two potentials can be provided to surface 111a' by power cord unit 113 and the use of two here is for illustrative purposes. For example, power cord unit 113 can include three conductive lines which provide positive, negative, and zero potentials to a corresponding number of conductive regions the same or similar to regions 116 and 117.

Figure 1C:
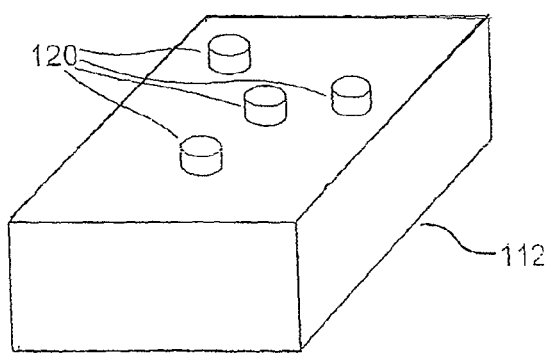
FIG. 1c is a perspective view of the bottom of an electronic device with contacts designed to obtain power from a power delivery surface.

FIG. 1c is a perspective view of the bottom of an electronic device 112 with contacts 120 designed to obtain power from a power delivery surface 111a. The contacts 120 on the electronic device 112 appear on the surface of the electronic device 112 which is intended to be placed on the power delivery surface 111a. The contacts 120 on the electronic device may be configured such that at least one contact is in electrical contact with a first conductive zone 116 of the power delivery surface 111a and a second contact is in electrical contact with a second conductive zone 117 of the power delivery surface 111a.

Figure 1D:
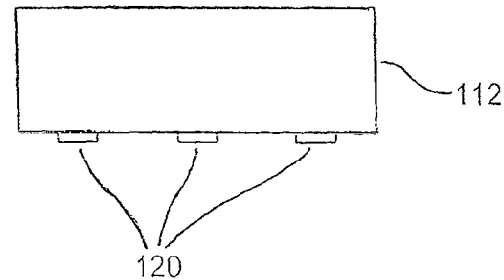
FIG. 1d is a side view of an electronic device with contacts designed to obtain power from a power delivery surface.

FIG. 1d is a side view of an electronic device 112 with contacts 120 designed to obtain power from a power delivery surface 111a. The contacts 120 may extend below the electronic device 112 to facilitate electrical contact with the power delivery surface 111a. FIGS. 1c and 1d show the relative structure of an electronic device 112 with contacts 120 in order to assist the reader in understanding the overall structure of the system prior to a more detailed discussion of specific portions of an embodiment. A more detailed disclosure regarding the structure, geometry and additional features of the power support structure 111 and the structure, geometry and additional features of the electronic device 112 is given in co-pending U.S. patent application Ser. No. 11/670,842 filed on Feb. 2, 2007, co-pending U.S. patent application Ser. No. 11/672,010 filed Feb. 6, 2007, and co-pending U.S. patent application Ser. No. 11/682,309 filed Mar. 5, 2007.

Figure 2A:
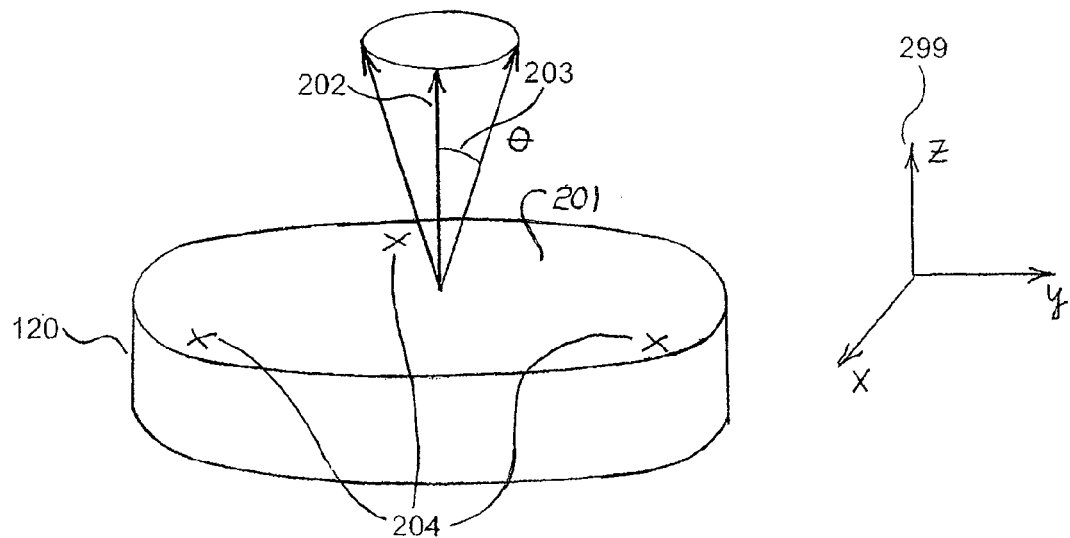
FIG. 2a is a schematic perspective view of a contact shaped to improve power delivery capable contact with a power delivery surface.

FIG. 2a is a diagrammatic perspective view of a contact 120 shaped to improve power delivery capable contact with a power delivery surface 111a. The three-dimensional aspect of the drawing in FIG. 2a is indicated by the x-y-z axis shown at 299. The shaped contact 120 of the electronic device 112 is used for power delivery capable contact between the electronic device 112 and the power delivery surface 111a. The shaped contact uses a special geometry to attain multiple, independent, contact redundancy, thereby improving power delivery reliability. For a shaped contact, the contact point for is not a point at all, instead, the contact point may be further subdivided into distinct contact regions. The shaped contact shown 120 appears as a circular disk. Other embodiments may use other shapes. The circular face 201 visibly depicts the face of the shaped contact 120 that will come in contact with the substantially planar power delivery surface 111a. Shown on the face 201 are three "x" marks 204 corresponding to desired independent contact regions of the shaped contact 120. While three contact regions permits three-fold, independent contact redundancy, other embodiments may have a different number of contact regions. For at least one embodiment it is assumed that a means is provided by which the contact button 120 can pivot within a solid angle θ 203 as shown in FIG. 2a. The vertical vector 202 represents the normal to the shaped contact face surface 201. The three regions of contact 204 are marked by "x's". However, for clarity, FIG. 2a does not show the contact regions 204 raised above the shaped contact's planar face surface 201.

Figure 2B:
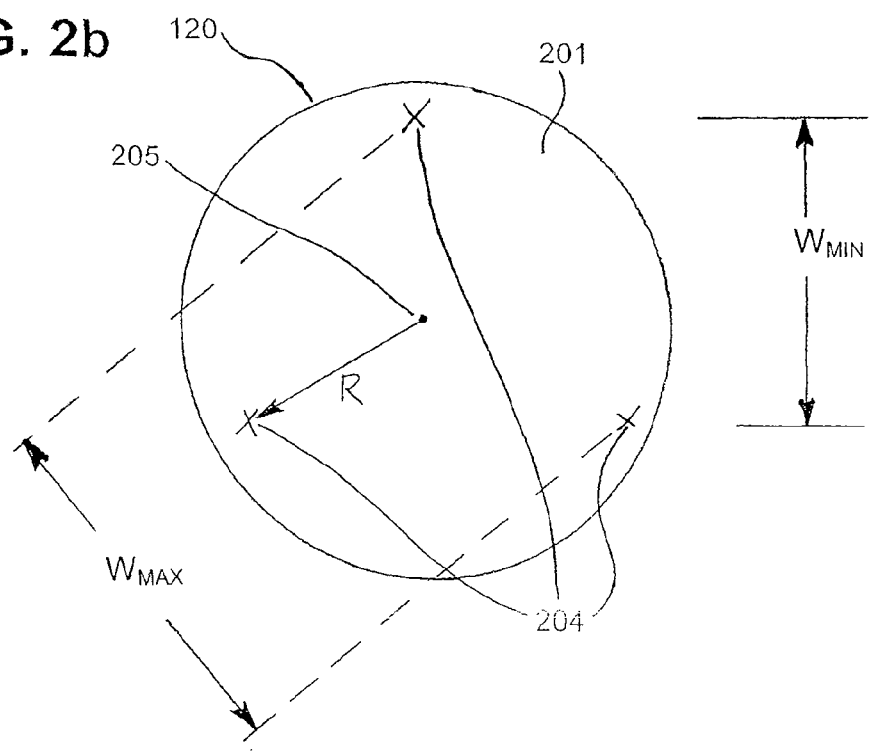
FIG. 2b is a schematic top view of the face of a contact shaped to improve power delivery capable contact with a power delivery surface.

FIG. 2b is a diagrammatic top view of the face 201 of a contact 120 shaped to improve power delivery capable contact with a power delivery surface. The three desired contact locations 204 are shown forming an equilateral triangle, with each point located and equal distance R from the center 205 of the shaped contact 120. For embodiments one could choose to locate the contact regions at other points and could use other geometric shapes and a different number of contact regions. Each shaped contact 120 may be pivotably mounted to the electronic device 112 to allow the contact regions 204 to align and rest on the power deliver surface 111a.

Generally, the outer diameter of the shaped contact 120 is chosen to be as large as possible without allowing the shaped contact 120 to short two adjacent electrodes 116, 117 of the power delivery surface 111a. The gap between electrodes 116 and 117 of the power delivery surface 111a is designated G. The parameter $W_{max}$ defines the greatest distance spanned by the shaped contact 118. $W_{max}$ must be less than the electrode gap G. For the equilateral triangle placement of the contact regions 204, $W_{max}$ is 1.732 times the radius R, and $W_{min}$ is 1.5 times R. Therefore, the radius R must be less than the gap G divided by 1.732 (i.e. which equals 0.577 * G).

Figure 2C:
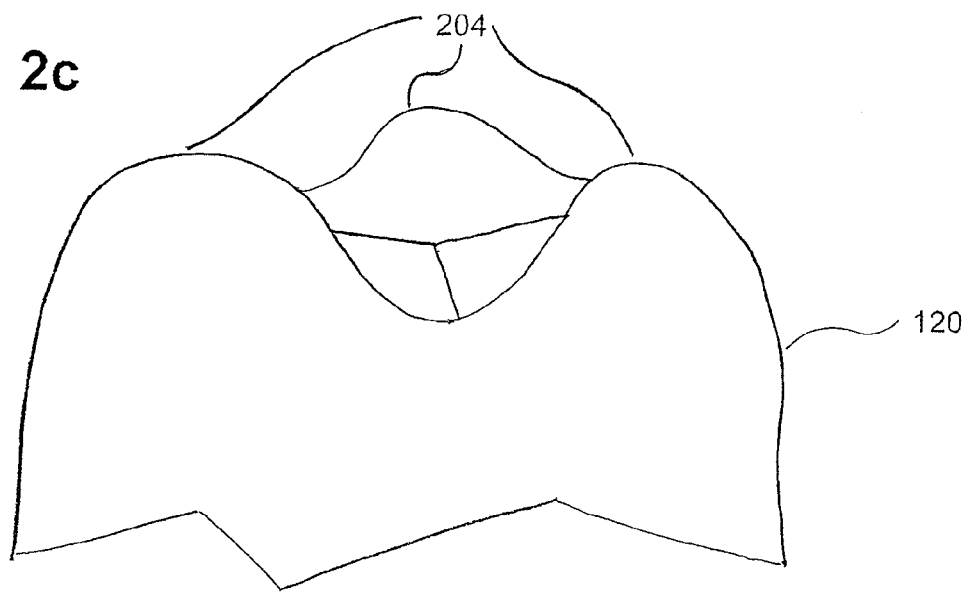
FIG. 2c is a side view of the physical shape of a contact shaped to improve power delivery capable contact with a power delivery surface.

FIG. 2c is a side view of the physical shape of a contact 120 shaped to improve power delivery capable contact with a power delivery surface. In accordance with FIGS. 2a and 2b, there are three raised regions 204. The highest point of each contact region 204 is located at the projection of the "x" marks in FIGS. 2a and 2b.

Figure 2D:
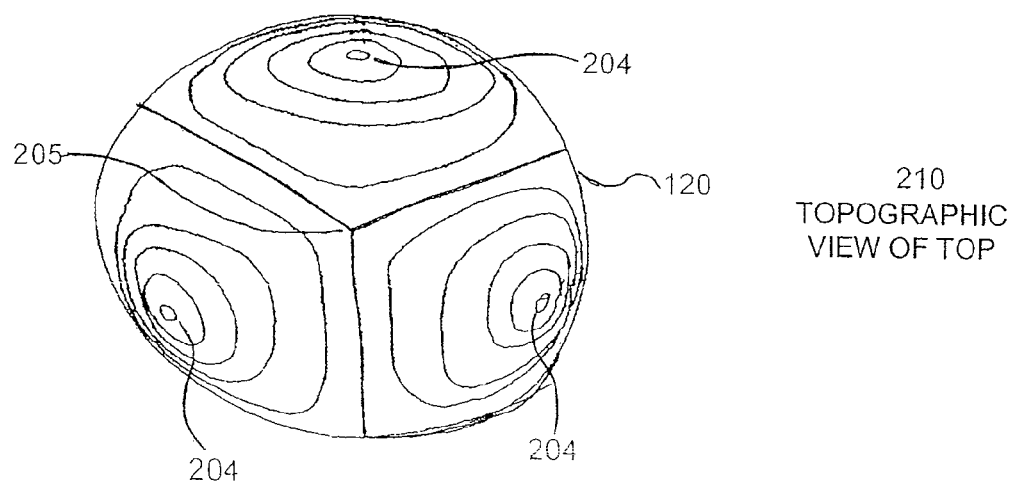
FIG. 2d is a topographical top view of the face of a contact shaped to improve power delivery capable contact with a power delivery surface.

FIG. 2d is a topographical top view 210 of the face of a contact 120 shaped to improve power delivery capable contact with a power delivery surface 111a. As shown, the contour lines of the contact regions 204 show an increasing height from the center 205 of the shaped contact 120 to the most elevated points of the contact regions 204. The contour lines indicate a constant change in height in the Z-dimension.

Figure 3A:
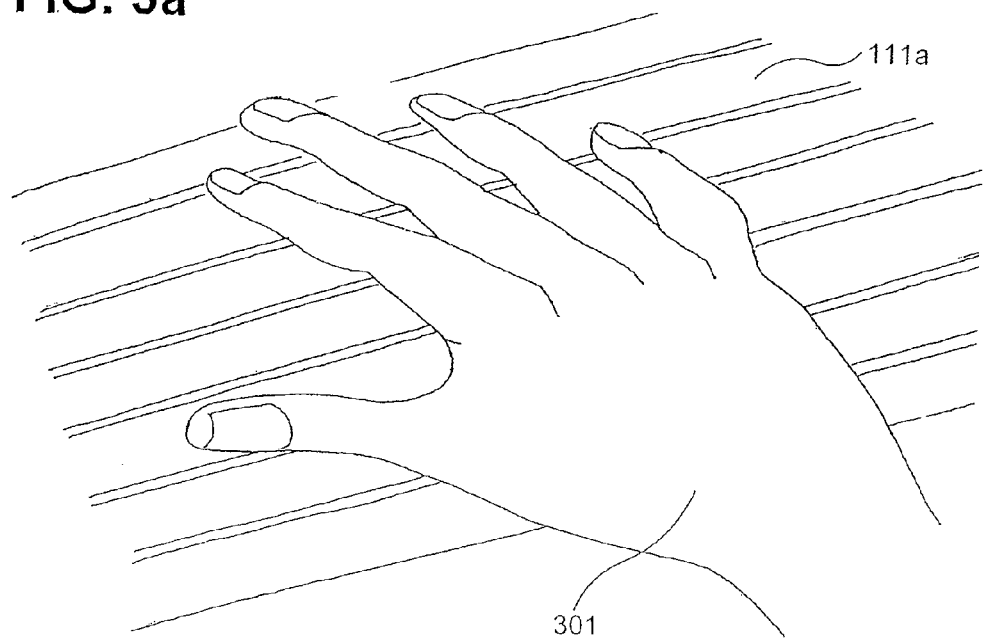
FIG. 3a is a schematic illustration of a hand on a power delivery surface.

FIG. 3a is a schematic illustration of a hand 301 on a power delivery surface 111a. For a conductive based power delivery surface 111a, if a person or animal makes electrical contact with both conductive zones 116, 117. the person or animal may be electrically shocked. When human or animal flesh comes in contact with the power delivery surface the output load typically has an unusually high capacitive component. To reduce the potential damage from electrical shock, a capacitive load detection circuit may be employed by the power delivery surface to detect unusually high capacitive loads. If an unusually high capacitive load is detected, a shut down circuit may shut down the power delivery surface to either avoid electrical shock or minimize the damage from an electrical shock. The shutdown circuit may use a preset capacitive load limit as the threshold for shutting down the system. The preset capacitive load limit may be set to a capacitive load threshold that is indicative of a person or animal being in contact with the power delivery system. There are many potential embodiments for a capacitive load detection and shutdown system. One embodiment is described in the disclosure with respect to FIG. 3b through 3d.

Figure 3B:
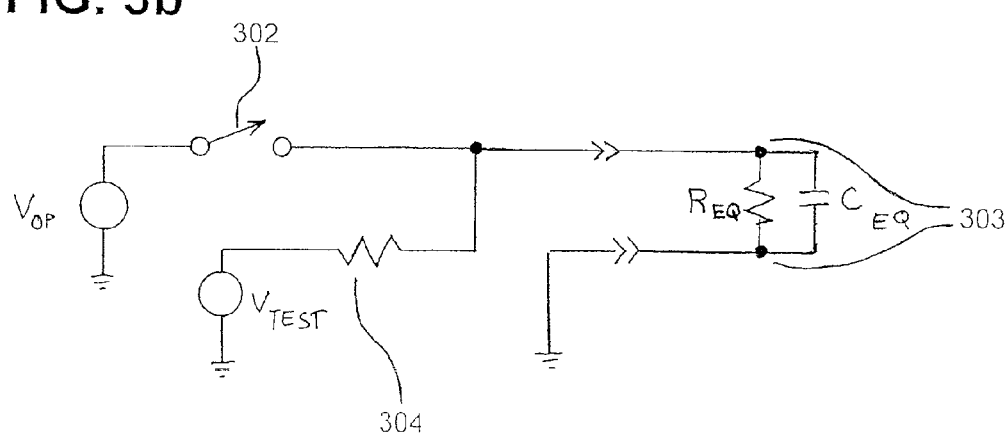
FIG. 3b is an electrical schematic of an equivalent circuit of a power delivery surface with a combined resistive (R) and capacitive (C) load.

FIG. 3b is an electrical schematic of an equivalent circuit of a power delivery surface 111a with a combined resistive ($R_{EQ}$) and capacitive ($C_{EQ}$) load. A human hand 301, or flesh in general, may be represented by an equivalent capacitive and resistive component connected in parallel. Thus, a human hand 301 resting on a set of electrodes such as those contained in a power delivery surface 111a may be represented by the equivalent circuit depicted in FIG. 3b, where $R_{EQ}$ and $C_{EQ}$ represent the load of the hand 301. A control unit (not shown) may contain the capacitive load detection circuit and the shut down circuit for a power delivery surface 111a. The control unit would measure the voltage ($V_{OP}$) across the output terminals 303, which, here, consists of $R_{EQ}$ and $C_{EQ}$. If the control unit detects an unusually high capacitive load, the control unit would operate the switch 302 to shut down the power delivery surface 111a.

Figure 3C:
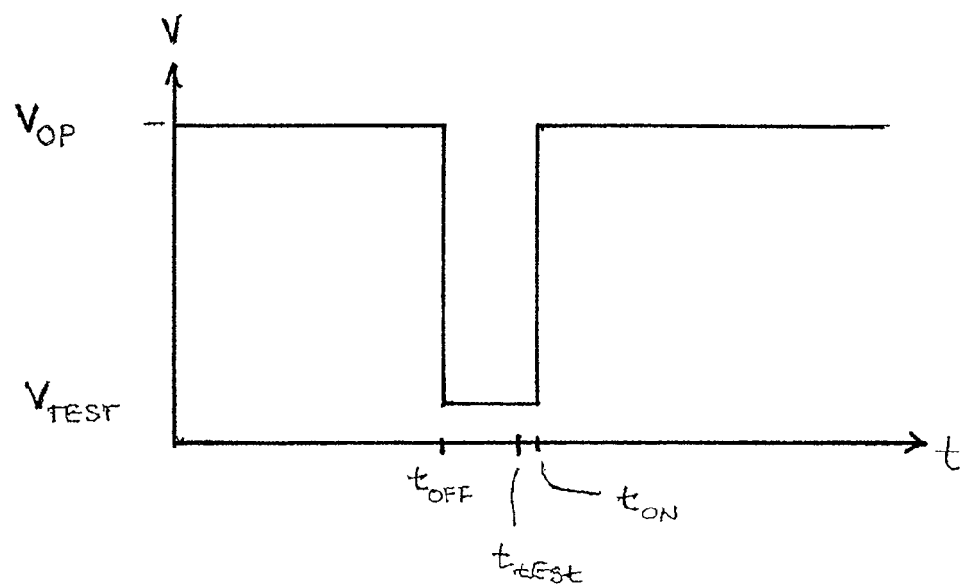
FIG. 3c is a graphical representation of a voltage waveform for a power delivery surface without a load.

FIG. 3c is a graphical representation of a voltage waveform for a power delivery surface 111a without a load. The control unit closes the switch 302 which applies $V_{OP}$ to the output terminals 303. Periodically, the control unit opens the switch 302 and, after a time, measures the voltage ($V_{OP}$) at the output terminals 303. This voltage ($V_{OP}$) must be within the preset limits of the applied test voltage $V_{TEST}$. Specifically, the switch 302 is opened at a time $t_{OFF}$. After a time interval elapses, the output voltage ($V_{OP}$) is measured at time $t_{TEST}$. At time $t_{TEST}$, the control unit determines if it is appropriate to close the switch 302 again to start the process over again. The switch is not actually turned on until time $t_{ON}$ accounting for the time it takes the control unit to decide to open the switch and to actually open the switch. With no load, the output voltage ($V_{OP}$) drops immediately to $V_{TEST}$ when the switch 302 is opened. Practically, the amount of time it takes to go to $V_{TEST}$ depends on the value of the resistor 304 connecting the test voltage ($V_{TEST}$) to the output terminals 303. To some degree the amount of time it takes to go to $V_{TEST}$ also depends on the stray capacitance present in the system.

Figure 3D:
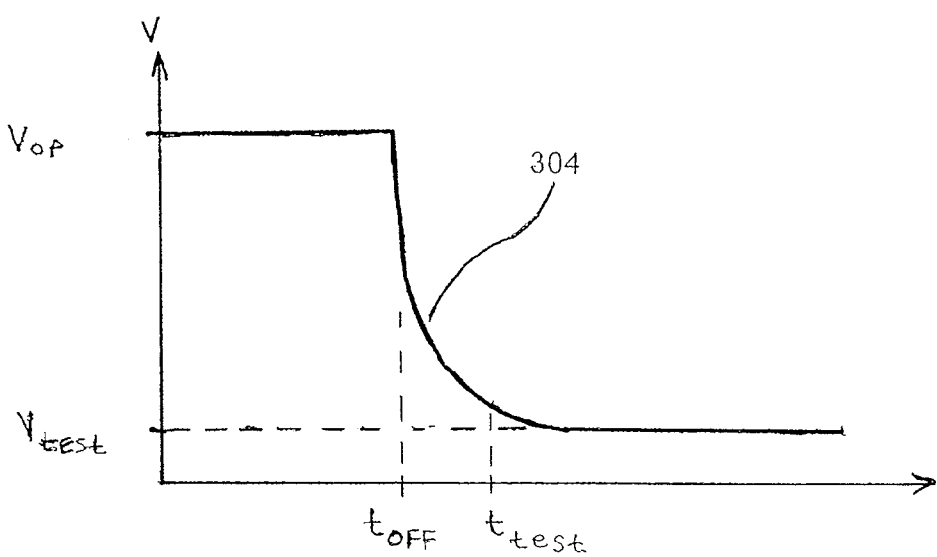
FIG. 3d is a graphical representation of a voltage waveform for a power deliver surface when a hand or other body part of a person or animal is resting on the power delivery surface.

FIG. 3d is a graphical representation of a voltage waveform for a power deliver surface when a hand 301 or other body part of a person or animal is resting on the power delivery surface 111a. The capacitance of a hand 301 or arm with typical electrode patterns suitable for a conductive based power delivery surface 111a is considerably greater than the stray capacitance intrinsically present in the power delivery surface 111a apparatus. In the presence of a significant capacitive load, as would be the case with a hand 301 or arm resting on the power delivery surface 111a, the voltage follows an exponential curve 305 characteristic of a Resistive-Capacitive (RC) discharge. Provided that a predetermined time delay exists between $t_{OFF}$ and $t_{TEST}$, and provided that there exists a voltage threshold below which the output must fall during the delay, a capacitance threshold may be implemented. If the capacitance present on the output terminals 303 is greater than a predetermined value, then the voltage at time $t_{TEST}$ will be greater than the predetermined threshold voltage value ($V_{TEST}$). Since the voltage did not fall below the $V_{TEST}$ threshold value at time $t_{TEST}$, the control unit did not close the switch 301 and the system is shut down. Thus, in FIG. 3d, the control unit did not turn the system back on since the voltage at time $t_{TEST}$ was greater than $V_{TEST}$. Once the capacitive load is removed, the system may automatically turn back on.

Generally, an electrical device may be retrofitted for use with a power delivery surface by attaching a power receiver to the electrical device that electrically connects the electrical device to a plurality of contacts that are part of the power receiver. The plurality of contacts are capable of receiving power from the power delivery surface, thus, enabling the electrical device to receive power from the electrical delivery surface.

Figure 4A:
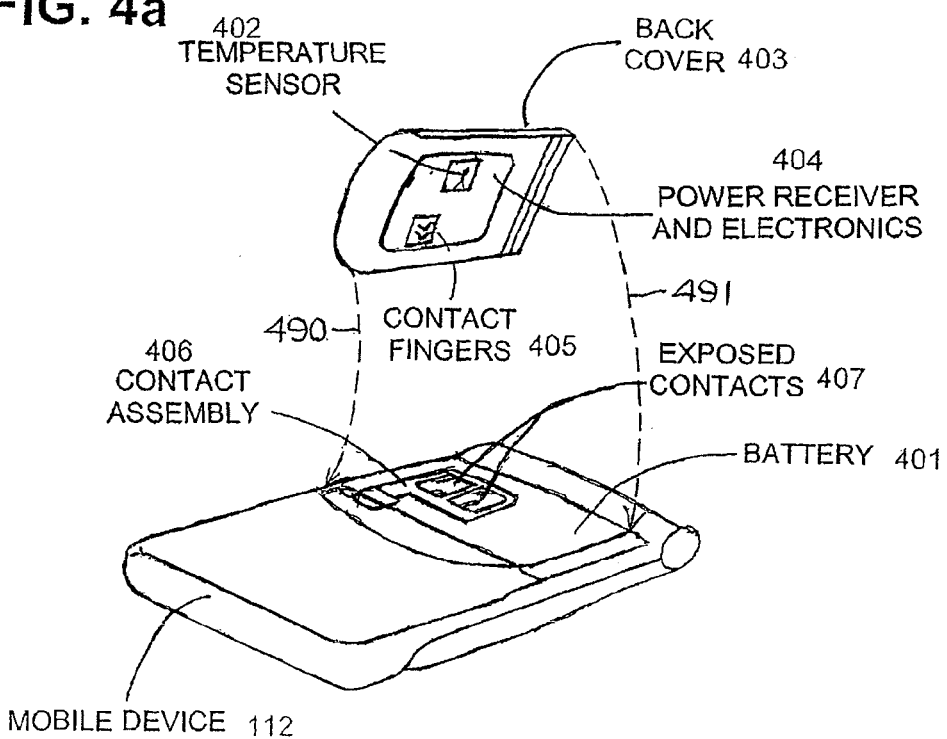
FIG. 4a is schematic diagram of a typical mobile device where a battery is accessible behind a removable back cover.

FIG. 4a is schematic diagram of a typical mobile device 112 where a battery 401 is accessible behind a removable back cover 403. In general, it is considered usual that the mobile device 112 rests on the mobile device's back cover 403 and back surface when set on a support surface 111a (FIGS. 1 and 2) with the back cover 403 properly attached on the device. 112 as indicated by broken lone arrows 490, 491. For a mobile device 112 that rests on the back cover 403, it is practical and convenient to deliver wire free power according to the system shown in FIG. 4a. A wire-free power receiver and electronics 404 may be integrated into the back cover 403 such that when the mobile device 112. with the back cover 403 properly attached, is at rest on a power delivery surface 111a, power can be sufficiently received by the mobile device 112. The power receiver includes a plurality of contacts, for example, the contacts 120 described above, designed for power delivery between a power delivery surface 111a and an electrical device 112. The plurality of contacts would be on the outside of the back cover 403 so that the contacts rest on the power delivery surface 111a. Contact fingers 405 on the inside of the back cover 403 make contact with contact assembly 406 attached to the mobile device battery 401. The contact assembly 406 is electrically connected to the mobile device battery 401. The contact assembly 406 has exposed contacts 407 that permit the contact assembly to make electrical contact with the contact fingers 405 on the back cover 403, that in turn, make electrical contact with the plurality of contacts that are part of the power receiver and electronics 404. A temperature sensor 402 may also be included in the power receiver and electronics 404 to monitor the heat of the mobile device battery 401 to ensure the mobile device battery 401 does not overheat while charging. The temperature sensor 402, or other sensors, may be included to increase safety and/or charging efficiency.

Figure 4B:
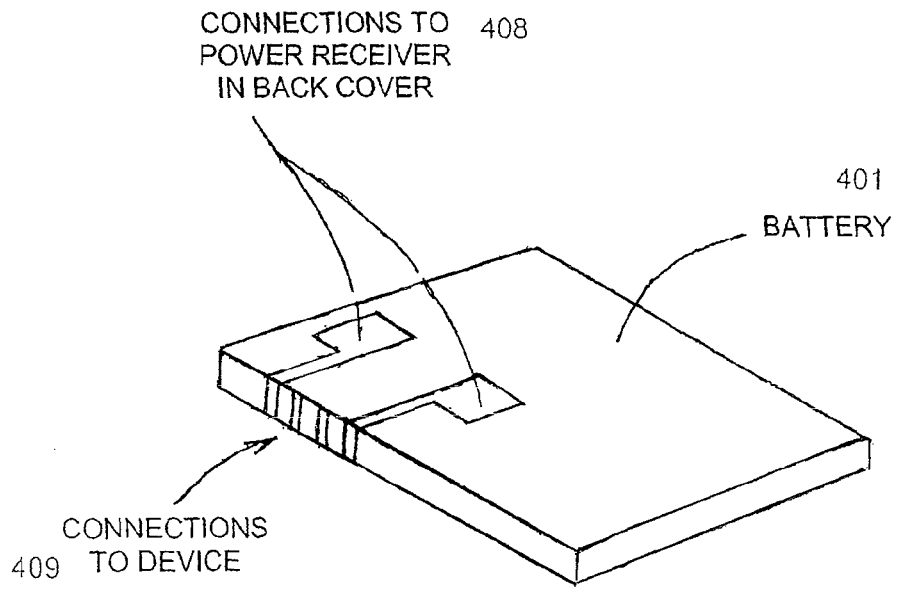
FIG. 4b is schematic diagram of a typical battery of a typical mobile device.
Figure 4C:
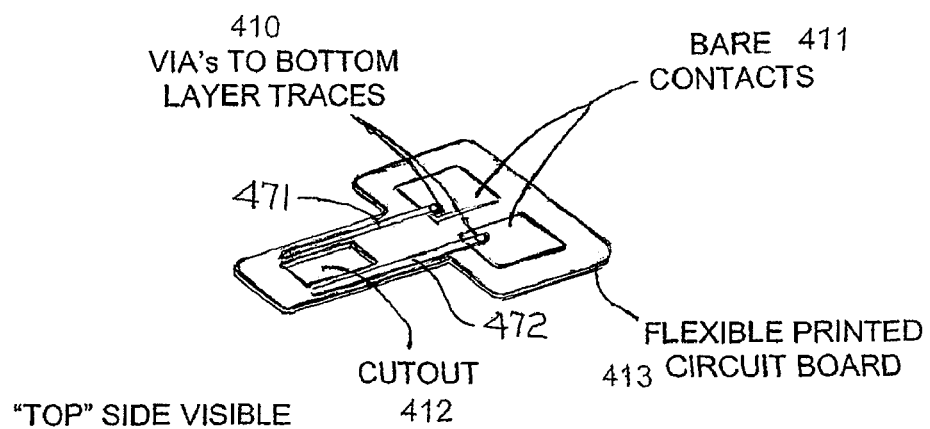
FIG. 4c is schematic diagram of the top side of a flexible printed circuit that adds contacts for use with a power delivery surface to an existing battery.

FIG. 4b is diagrammatic isometric view of a typical battery 401 of a typical mobile device 112. The battery shown 401 has connections on the side 409 intended to connect the host mobile device 112 to the battery for power transfer and battery management. The battery connections 409 to the mobile device 112 may appear in other locations for other embodiments. The exposed battery contacts 408 on top of the battery 401 allow charging current to flow into the battery 401 from the power receiver 404 integrated into the back cover 403. In one embodiment, the battery 401 is a smart battery and implements a data bus between itself and the host mobile device 112. In one variation of the embodiment, the power receiver 404 does not have access to data available from the battery 401 on the smart data bus. When the power receiver 404 does not have access to the-smart data bus, the power receiver 404 does not have complete information on the system status, including information that the battery 401 may be receiving about charging current from the host mobile device 112. The power receiver 404 may not have access to the smart data bus if the host mobile device 112 is plugged into a USB cable (for example) and is being charged via the USB power source. If the mobile device 112 back cover 403, with its contacts 120 (FIGS. 1c -2d, is simultaneously resting on a power delivery surface 111a (FIGS. 1a -1b) the power receiver 404 may also be supplying charging current to the battery 401 resulting in a potentially unsafe situation in which the battery 401 could be damaged or destroyed. A temperature sensor 402 in the power receiver 404 arranged to monitor the battery temperature may be used to maintain safety. The temperature sensor 402 shuts down the charging current from the power receiver 404 if the battery temperature exceeds a predetermined threshold.

Figure 4D:
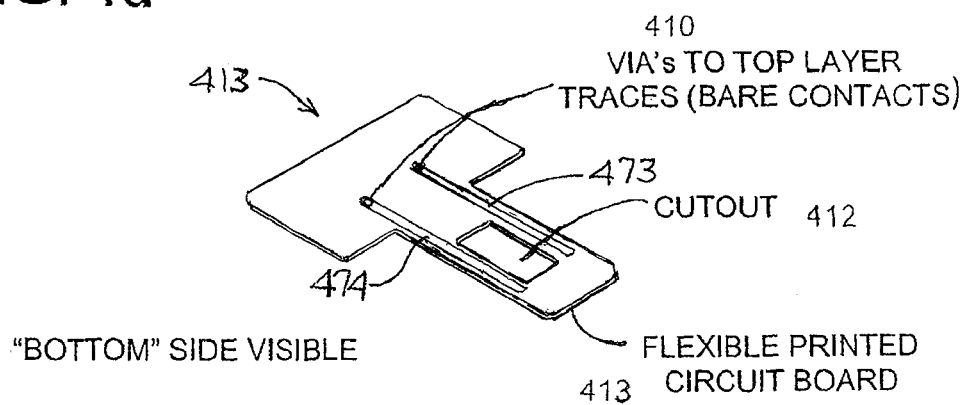
FIG. 4d is schematic diagram of the bottom side of a flexible printed circuit that adds contacts for use with a power delivery surface to an existing battery.

The contacts {408} on the battery 401 may be built into the battery from the manufacturer, as illustrated in FIG. 4b, using techniques known to those skilled in the art. Alternatively, such contacts may be added to an existing battery using a flexible circuit 413, as illustrated in FIGS. 4c -4f FIG. 4c is a schematic diagram of the top side of an example flexible printed circuit 413 that can be used to add contacts, 411, similar to contacts 408, to an existing battery 401 for receiving power from a delivery surface 111a (FIGS. 1a -b. The "top" side of the flexible circuit board 413 provides the bare contacts 411 on the battery 401 for connection to the power receiver 404 while simultaneously allowing connection of the battery 401 to the host mobile device 112. This is enabled by the cutout 412, and by traces 471, 472, 473, 474 on both sides of the printed circuit 413 that are connected together (e.g., trace 471 to trace 473 and trace 472 to trace 474) to form a pass-through connection by vias 410 between the top and bottom sides of the flexible printed circuit 413. FIG. 4d is schematic diagram of the bottom side of the flexible printed circuit 413 that adds contacts 411 for use with a power delivery surface 111a to an existing battery 401

Figure 4E:
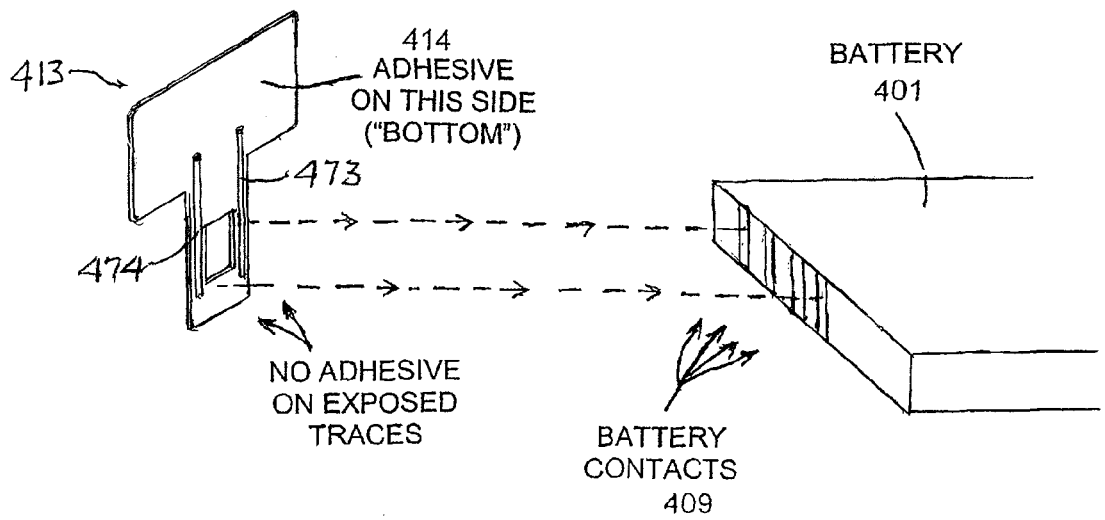
FIG. 4e is schematic diagram of a flexible printed circuit that adds contacts for use with a power delivery surface being attached to an existing battery.

FIG. 4e is schematic diagram of the flexible printed circuit 413 that adds contacts for use with a power delivery surface 111a being attached to an existing battery 401. Adhesive on the "bottom" of the flexible printed circuit 414 can be used to keep the flexible printed circuit 413 affixed to the battery 401. There is no adhesive on the exposed traces 473, 474 that would interfere with the electrical connection to the battery 404.

Figure 4F:
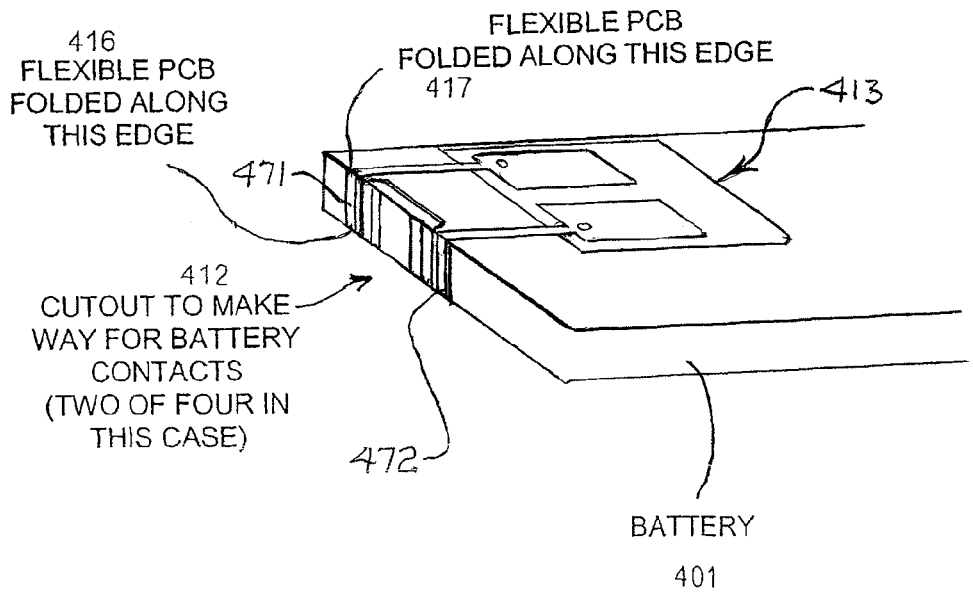
FIG. 4f is schematic diagram of a flexible printed circuit that adds contacts for use with a power delivery surface attached to an existing battery.

FIG. 4f is schematic diagram of the flexible printed circuit 413 attached to an existing battery 401. The traces 473, 474 and cutout 412 of the flexible printed circuit 413 are arranged to align with the battery contacts 409 when the flexible printed circuit board 113 is mounted on and adhered to the battery 401 with the portion including the cutout 412 and the traces 471, 472, 473, 474 adjacent the cutout 412 folded over the edges 416, 417 of the battery 401. The cutout 412 allows certain of the battery contacts 409 to remain exposed for connection to the host mobile device 112. Where the flexible circuit board 413 covers selected battery contacts 409, the circuit traces 473, 474 on the bottom side of the flexible circuit board 413 are aligned over the battery contacts 409 to make electrical connections with the battery contacts 409, while the top-side 471, 473 are also aligned over the selected battery contacts 409 to duplicate the battery connection to the host mobile device 112. In one embodiment, the top-side traces 471, 472 and the bottom-side traces 473, 474 over given battery contacts 409 are connected through the via 410 in the flexible printed circuit 413. The via 410 provides a tap into the selected battery contacts 409 without affecting operation with the host mobile device 112. In other embodiments, other circuitry may be provided between the top and bottom-side traces to provide alternative functionality. The connections of the bottom-side traces 473, 474 to the corresponding battery contacts 409 are realized through the contact pressure supplied by the spring-loaded contact fingers (not shown and not the contact fingers 405 on the back cover 403) that are normally present in the host mobile device 112 to make the connection of the electronics of the host mobile device 112 to the battery 401. The flexible printed circuit 413 is compliant sufficiently to not significantly react against the pressure of the host mobile device's contact fingers. In addition, gold plating may be used on the traces 471, 472, 473, 474 to ensure good electrical connections.

Figure 5A:
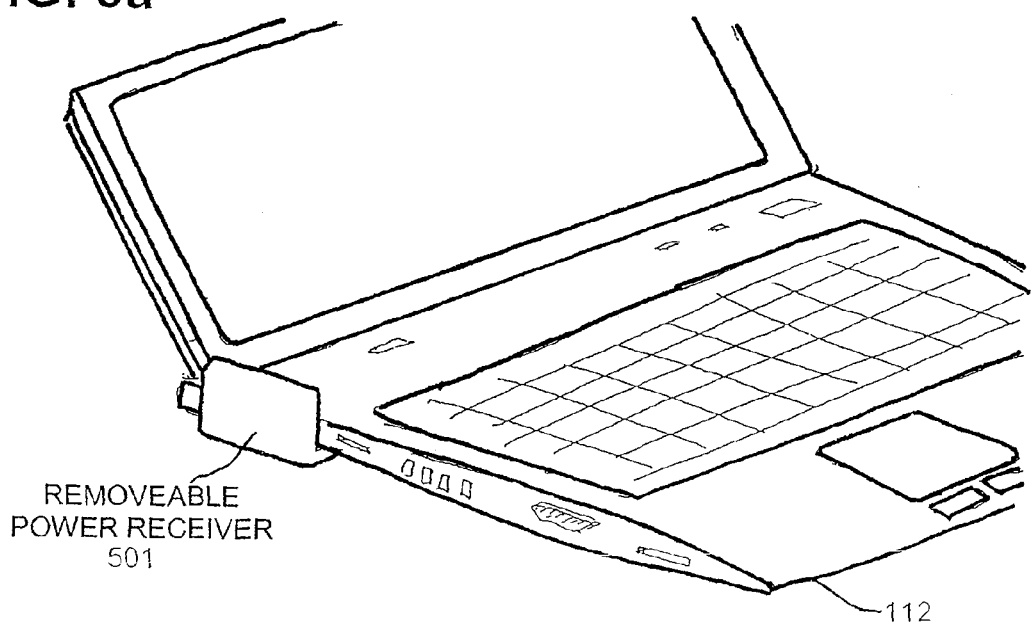
FIG. 5a is a schematic diagram of a removable power receiver that adds contacts for use with a power delivery surface attached to a larger host mobile device.
Figure 5B:
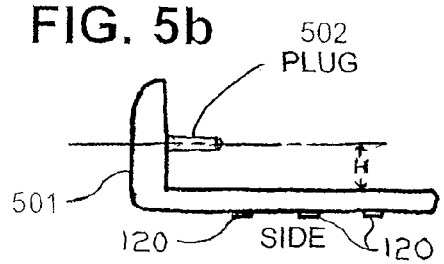
FIG. 5b is a schematic diagram of a side view of a removable power receiver that adds contacts for use with a power delivery surface to a larger host mobile device.
Figure 5C:
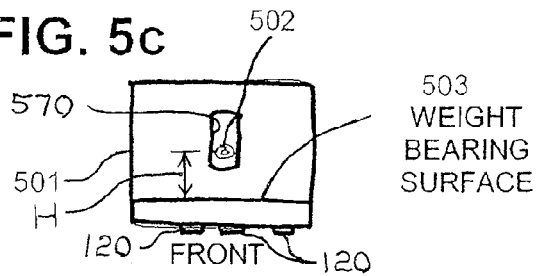
FIG. 5c is a schematic diagram of a front view of a removable power receiver that adds contacts for use with a power delivery surface to a larger host mobile device.
Figure 5D:
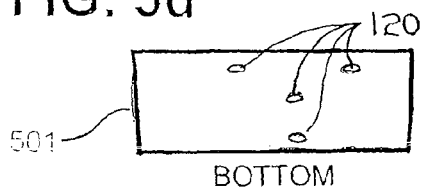
FIG. 5d is a schematic diagram of a bottom view of a removable power receiver that adds contacts for use with a power delivery surface to a larger host mobile device.
Figure 5E:
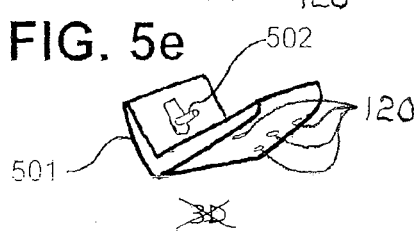
FIG. 5e is a schematic diagram of a three dimensional view of a removable power receiver that adds contacts for use with a power delivery surface to a larger host mobile device.

FIG. 5a is a schematic diagram of a removable power receiver 501 that adds contacts for use with a power delivery surface 111a attached to a larger host mobile device 112, for example, the laptop computer illustrated in FIG. 5a. The removable power receiver 501 may be designed to support the weight of the larger mobile device 112 when the system is resting on the power delivery surface 111a (FIGS. 1a -1b). The removable power receiver 501 plugs into the host mobile device's existing power input port.

FIGS. 5b, 5c, 5d, and 5e are diagrams of a side view, a front view, a bottom view, and an isometric view, respectively, of a removable power receiver 501 that adds contacts for use with a power delivery surface 111a to a larger host mobile device 112. The plug 502 on the power receiver 501 plugs into the power receptacle on the larger mobile device 112. The plug 502 on the power receiver 501 is able to slide up and down in a slot 570 such that the height H of the plugs 502 with respect to the weight bearing surface 503 may vary as needed. Varying the height H of the plug 502 allows the host mobile device 112 to rest on the portion of the power receiver (e.g., the weight bearing surface 503) that lies below the host mobile device 502 without applying significant pressure to the electrical plug 501.

FIG. 5f is a schematic diagram of a removable power receiver 501 with a spring loaded shelf 504 that adds contacts for use with a power delivery surface 111a attached to a larger host mobile device 112. The electrical plug 502 may be spring loaded slightly in such a way as to minimize H when at rest. The slight pressure of the spring would keep the power receiver 501 attached to the host mobile device 112. Alternatively a spring loaded shelf 504 may be used to clamp onto the host mobile device 112. For the spring loaded shelf 504, the plug 502 on the power receiver 501 would be free-floating and would not need to be spring loaded as discussed above. An embodiment may be designed such that the power receiver 501 would be compatible with many types of host mobile devices 112. The plug 502 of the power receiver 501 that connects to the power input of the host mobile device 112 would be interchangeable such that many types of plugs would fit on the power receiver 501.

Since these and numerous other modifications and combinations of the above-described method and embodiments will readily occur to those skilled in the art, it is not desired to limit the invention to any of the exact construction and process shown and described above. While a number of example aspects and embodiments have been discussed above, those of skill in the art will recognize certain modifications, permutations, additions, and sub-combinations thereof. It is therefore intended that the following appended claims and claims hereafter introduced are interpreted to include all such modifications, permutations, additions, and sub-combinations as are within their true spirit and scope. The words "comprise," "comprises," "comprising," "has," "have," "having," "include," "including," and "includes" when used in this specification and in the following claims are intended to specify the presence of stated features or steps, but they do not preclude the presence or addition of one or more other features, steps, or groups thereof.

What is claimed is:

1. Electrical apparatus, comprising:
a power delivery surface that comprises at least a part of a support surface, said power delivery surface being connected to an electrical power source, said power delivery surface being capable of supplying electrical power, and said power delivery surface having a plurality of pads, wherein some of said pads are at a first voltage level and others of said pads are at a second voltage level; and
an electrical device, which is supplied electricity and is positionable in any location on the support surface, said electrical device obtaining electrical power from said power delivery surface that is at least part of said support surface; and
a power receiver device comprising a flexible, printed circuit that is attachable to a battery of the electrical device and is electrically connected to said electrical device and said battery in order to provide a plurality of contacts to said electrical device, wherein said plurality of contacts are spaced apart in relation to each other in positions to make power delivery capable contact with said power delivery surface; and a back cover of said electrical device that has contact fingers on an inside portion of said back cover that are electrically connected to said plurality of contacts on an outside of said back cover such that said contact fingers electrically connect to said back cover such that said contact fingers electrically connect to said flexible printed circuit when said back cover is placed on said electrical device and there is an electrical connection from said plurality of contacts to said battery.

2. The electrical apparatus of claim 1 further comprising power and receiver electronics built into said back cover to regulate power delivered to said mobile device battery.

3. The electrical apparatus of claim 1 wherein said flexible printed circuit board is positionable between the battery and the electrical device and has a cutout in an area where electrical contacts of the battery make contact with mating electrical contacts in the electrical device to accommodate battery connections between said mobile device and said mobile device battery.

4. The electrical apparatus of claim 1 wherein said power receiver device may be removed from said electrical device and said power receiver contains a plug to plug into a power receptacle on said electrical device.

5. The electrical apparatus of claim 4 wherein said power receiver device comprises a hardened structure capable of supporting said electrical device such that said plug does not solely support said electrical device.

6. Electrical apparatus, comprising:
a power delivery surface that comprises at least part of a support surface, said power delivery surface being connected to an electrical power source, said power delivery surface being capable of supplying electrical power, and said power delivery surface having a plurality of pads, wherein some of said pads are at a first voltage level and others of said pads are at a second voltage level;
an electrical device, which is supplied electricity and is positionable in any location on a support surface, said electrical device obtaining electrical power from said power delivery surface and that is at least part of said support surface; and
a power receiver device that is removably attachable and electrically connectable via a plug to said electrical device in order to provide a plurality of contacts to said electrical device, said plurality of contacts being spaced apart in relation to each other in positions to make power delivery capable contact with said power delivery surface, wherein said plug is spring loaded to further alleviate weight stress on said plug.

7. Electrical apparatus, comprising:
a power delivery surface that comprises at least a part of a support surface, said power delivery surface being connected to an electrical power source, said power delivery surface being capable of supplying electrical power, and said power delivery surface having a plurality of pads, wherein some of said pads are at a first voltage level and others of said pads are at a second voltage level; and
an electrical device that includes: (a) an electronic device circuit which enables operable functions of the electrical device; (b) a rechargeable battery electrically connected to the electronic device circuit for providing electric power to the electronic device circuit; (c) a housing containing the electronic device circuit and the rechargeable battery; and (d) a detachable cover of said electrical device that has an inside surface and an outside surface and comprises power receiver apparatus and circuitry, wherein said power receiver apparatus and circuitry includes: (i) a plurality of external contacts extending outwardly from the external surface of the back cover in a spatial relation to each other that enables power transfer from the power delivery surface to the power receiver apparatus and circuitry when the back cover of the electrical device is positioned on the power delivery surface and interface; (ii) a plurality of internal contacts that are physically located to align and make electrical contact with interfacing electrical contacts electrically connected to the electronic device circuit and/or the rechargeable battery when the cover is attached to the housing for transmitting electric power from the external contacts to the electronic device circuit and/or the rechargeable battery when the electrical device is placed on the power delivery surface with the external contacts in electrical contact with the power delivery surface.

8. The electrical apparatus of claim 7, wherein the internal contacts include contact fingers.

9. The electrical apparatus of claim 7, including an interface contact assembly interposed between a mating set of contacts of the rechargeable battery and of the electronic device circuit, said interface contact assembly including the interfacing electrical contacts and a set of traces for electrically connecting the interfacing electrical contacts with the mating set of contacts of the rechargeable battery and of the electronic device circuit.

10. The electrical apparatus of claim 9, wherein the interface contact assembly includes a flexible printed circuit board comprising the interfacing electrical contacts and the set of traces.

11. The electrical apparatus of claim 10, wherein the flexible printed circuit board comprises a flexible, non-conductive substrate supporting the traces on opposite surfaces of the substrate, and wherein a paired set of the traces on the opposite surfaces are electrically connected together such that, when the printed circuit board is interposed between the mating contacts of the battery and of the electronic circuit with one of the set of paired traces positioned in contact with one of the mating battery contacts and the other of the paired traces is positioned in contact with one of the mating electronic circuit contacts, the mating battery contact and the mating electronic circuit contact are electrically connected together by the interposed paired set of traces on the printed circuit board.

12. The electrical apparatus of claim 11, wherein the flexible printed circuit board has a portion of the non-conductive substrate cut out adjacent the paired sets of traces to allow additional mating contacts of the battery and the electronic circuit to be in direct electronic contact with each other.

13. An electrically powered device that has a housing containing an electronic operating circuit which enables functions of the device and a rechargeable battery assembly with battery contacts located to interface and make electrical contact with mating contacts of the electronic operating circuit to provide electrical power to the electronic operating circuit, comprising:
a detachable cover assembly that has an inside surface and an outside surface and is attachable to the housing adjacent the battery, said cover assembly including power receiver apparatus and circuitry comprising: (i) a plurality of external contacts extending outwardly from the external surface of the detachable cover assembly in a spatial relation to each other that is adapted to receive electric power from an electric power source; and (ii) a plurality of internal contacts that are physically located to align and make electrical contact with interfacing contacts of the battery assembly and/or the electronic operating circuit when the cover assembly is attached to the housing.

14. The electrically powered device of claim 13, wherein the internal contacts include contact fingers.

15. The electrically powered device of claim 13, including an interface contact assembly interposed between a mating set of contacts of the rechargeable battery assembly and of the electronic operating circuit, said interface contact assembly including a set of traces for electrically connecting the internal contacts of the cover assembly to the contacts of the battery assembly and/or the electronic operating circuit.

16. The electrically powered device of claim 15; wherein the interface contact assembly includes a printed circuit board comprising a non-conductive substrate interposed between the battery assembly contacts and the electronic operating circuit contacts with electric traces on opposite surfaces of the non-conductive substrate aligned to make electric contact with the respective battery assembly contacts on one side of the non-conductive substrate and with the respective electronic operating circuit contacts on the opposite side of the non-conductive substrate, said respective traces on the opposite sides of the non-conductive substrate being electrically connected to each other so that electric power from the external contacts applied to the traces of the printed circuit board is effectively applied to both the battery contacts and the electronic operating circuit contacts when the cover assembly is attached to the housing.

17. The electrically powered device of claim 16, wherein the non-conductive substrate has a cut-out portion adjacent the traces to accommodate other contacts of the battery assembly to make electrical contact with mating other contacts of the electronic operating circuit without interruption by the non-conductive substrate interposed between the battery assembly and the electronic operating circuit.

18. The electrically powered device of claim 16, wherein the non-conductive substrate is flexible and formable around edges of the battery assembly with the traces in contact with respective contacts of the battery assembly.

19. The electrically powered device of claim 16, including adhesive on the non-conductive substrate for adhering the non-conductive substrate to the battery assembly.

20. A method of equipping an electronic device, which has a rechargeable battery assembly and an electronic device circuit contained in a housing with contacts of the rechargeable battery assembly in physical alignment and electrical contact with mating contacts of the electronic device circuit, to be capable of receiving electric power from a power delivery surface, including:
 attaching a cover assembly, which has power receiver apparatus and circuitry comprising a plurality of external contacts in a spatial relationship adapted to receive power from the power delivery surface and a plurality of internal contacts that are located to align and make electrical contact with interfacing contacts of the rechargeable battery assembly and/or the electronic device circuit, onto the housing adjacent the rechargeable battery assembly with the internal contacts of the cover assembly in alignment to make electrical contact with exposed contacts of the battery assembly and/or the electronic device circuit.

21. The method of claim 20, including interposing a printed circuit board having paired sets of electrically connected traces on opposite sides of the printed circuit board between the battery assembly and the electronic circuit with the paired sets of traces spatially aligned and in electrical contact with respective battery contacts and mating electronic device circuit contacts so that the battery contacts and the mating electronic device circuit contacts are electrically connected to each other through the traces of the printed circuit board, and providing bare interface contacts on the printed circuit board as part of, or electrically connected to, the traces in alignment with the internal contacts of the power receiver apparatus and circuitry so that attaching the cover assembly to the housing places the internal contacts in electrical contact with the bare interface contacts to provide electric power from the external contacts to rechargeable battery assembly and/or electronic device circuit via the printed circuit board.

22. The method of claim 21, including adhering the printed circuit board on the rechargeable battery assembly.

23. The method of claim 21, including wrapping the printed circuit board around a portion of the rechargeable battery assembly with the paired traces aligned and in contact with respective ones of the rechargeable battery assembly contacts.

* * * * *